(12) United States Patent
Shiota et al.

(10) Patent No.: US 9,293,390 B2
(45) Date of Patent: Mar. 22, 2016

(54) HEAT RADIATION STRUCTURE FOR SEMICONDUCTOR DEVICE

(71) Applicant: MITSUBISHI ELECTRIC CORPORATION, Chiyoda-ku (JP)

(72) Inventors: Hiroki Shiota, Chiyoda-ku (JP); Atsushi Yamatake, Chiyoda-ku (JP); Kenichi Suga, Chiyoda-ku (JP); Yoshihiro Yamaguchi, Chiyoda-ku (JP); Tetsuya Ueda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/437,265

(22) PCT Filed: Dec. 20, 2013

(86) PCT No.: PCT/JP2013/084203
§ 371 (c)(1),
(2) Date: Apr. 21, 2015

(87) PCT Pub. No.: WO2014/109208
PCT Pub. Date: Jul. 17, 2014

(65) Prior Publication Data
US 2015/0255370 A1 Sep. 10, 2015

(30) Foreign Application Priority Data
Jan. 11, 2013 (JP) .................. 2013-003168

(51) Int. Cl.
*H01L 23/00* (2006.01)
*H01L 23/373* (2006.01)
(Continued)

(52) U.S. Cl.
CPC ............ *H01L 23/3737* (2013.01); *H01L 23/08* (2013.01); *H01L 23/36* (2013.01);
(Continued)

(58) Field of Classification Search
CPC ................ H01L 23/482; H01L 23/495; H01L 23/49558; H01L 23/49575; H01L 23/49586
See application file for complete search history.

(56) References Cited

U.S. PATENT DOCUMENTS 6,211,563 B1 * 4/2001 Tzu ................................ 257/678
6,448,583 B1 * 9/2002 Yoneda et al. .................. 257/81
(Continued)

FOREIGN PATENT DOCUMENTS

JP 02-166753 A 6/1990
JP 4-188656 A 7/1992
(Continued)

OTHER PUBLICATIONS

International Search Report issued Mar. 3, 2014 in PCT/JP2013/084203 filed Dec. 20, 2013.

*Primary Examiner* — Ngan Ngo
(74) *Attorney, Agent, or Firm* — Oblon, McClelland, Maier & Neustadt, L.L.P.

(57) ABSTRACT

A semiconductor device with improved heat radiation and improved insulation performance. The semiconductor device includes a semiconductor element, a lead frame bonded on one surface to the semiconductor element, a first insulating layer disposed on the other surface of the lead frame, and a metal base plate connected to the lead frame with the first insulating layer interposed between them, wherein an outer peripheral portion of the first insulating layer is inside an outer peripheral portion of the metal base plate, and the outer peripheral portion of the first insulating layer is covered with a second insulating layer having higher moisture resistance and higher insulation performance than the first insulating layer, the outer peripheral portion including an electric field concentrated point in an outer peripheral portion of the lead frame.

5 Claims, 5 Drawing Sheets (51) Int. Cl.
  *H01L 23/495* (2006.01)
  *H01L 23/482* (2006.01)
  *H01L 23/36* (2006.01)
  *H01L 23/433* (2006.01)
  *H01L 23/08* (2006.01)
  *H01L 23/498* (2006.01)
  *H01L 29/16* (2006.01)
  *H01L 29/20* (2006.01)

(52) U.S. Cl.
  CPC .......... *H01L23/4334* (2013.01); *H01L 23/482* (2013.01); *H01L 23/495* (2013.01); *H01L 23/49558* (2013.01); *H01L 23/49586* (2013.01); *H01L 23/49838* (2013.01); *H01L 23/49861* (2013.01); *H01L 23/564* (2013.01); *H01L 29/1602* (2013.01); *H01L 29/1608* (2013.01); *H01L 29/2003* (2013.01); *H01L 23/49562* (2013.01); *H01L 23/49575* (2013.01); *H01L 2224/2929* (2013.01); *H01L 2224/32245* (2013.01); *H01L 2924/1305* (2013.01); *H01L 2924/13055* (2013.01)

(56) References Cited

U.S. PATENT DOCUMENTS

| | | | |
|---|---|---|---|
| 2009/0034163 A1* | 2/2009 | Kabe et al. | 361/528 |
| 2011/0273846 A1 | 11/2011 | Kawabata et al. | |
| 2012/0080809 A1* | 4/2012 | Wada | 257/789 |
| 2013/0062742 A1* | 3/2013 | Warren et al. | 257/666 |

FOREIGN PATENT DOCUMENTS

| | | |
|---|---|---|
| JP | 11-176882 A | 7/1999 |
| JP | 2002-76197 A | 3/2002 |
| JP | 2003-137627 A | 5/2003 |
| JP | 2003-286394 A | 10/2003 |
| JP | 2005-210006 A | 8/2005 |
| JP | 2006-303086 A | 11/2006 |
| JP | 2008-034632 A | 2/2008 |
| JP | 2011-6586 A | 1/2011 |
| JP | 2011-211190 A | 10/2011 |
| JP | 2012-224676 A | 11/2012 |
| JP | 2013-18886 A | 1/2013 |
| JP | 2013-87191 A | 5/2013 |
| WO | 2010-084955 A1 | 7/2010 |

* cited by examiner

HEAT RADIATION STRUCTURE FOR SEMICONDUCTOR DEVICE

TECHNICAL FIELD

The present invention relates to a semiconductor device, and more particularly, to a semiconductor device in which a semiconductor element such as an Insulated Gate Bipolar Transistor (IGBT) and a diode producing high heat is disposed on a metal base plate with a high radiation insulating layer interposed between them.

BACKGROUND ART

Semiconductor devices require radiation of heat produced in semiconductor elements in order to control the operating temperature to within a predetermined range. To address this, a known semiconductor device includes a metal base plate with high thermal conductivity disposed on the back of a ceramic substrate to which semiconductor elements are bonded (see, for example, PTL 1).

In such a semiconductor device, heat produced in any semiconductor element is conducted to the metal base plate through an insulating layer such as the ceramic substrate and an organic insulating sheet and is radiated through a cooler connected to the metal base plate to improve the heat radiation. With an increasingly higher density of integrated semiconductor elements in recent years, however, the heat radiation needs to be further improved.

In addition, the use of an organic insulating sheet as the insulating layer between the semiconductor element and the metal base plate has been disclosed. The organic insulating sheet includes inorganic powder (filler) with high thermal conductivity mixed in order to increase thermal conductivity (see, for example, PTL 2).

CITATION LIST

Patent Literature

PTL 1: JP-A-2006-303086
PTL 2: JP-A-2003-137627

SUMMARY OF INVENTION

Technical Problem

The organic insulating sheet or the ceramic substrate for use as the insulating layer which is a component of such a semiconductor device requires an insulation performance for stably driving the semiconductor device as well as the heat radiation.

Especially, in recent years, as the element such as a SiC element produces higher heat due to a larger current and a higher frequency in operation, and the semiconductor device is reduced in size and is operated at a higher voltage rating, the organic insulating sheet and the ceramic substrate need to have the property of efficiently radiating the heat produced in the semiconductor element to the metal base plate without deteriorating reliability in insulation performance.

The semiconductor device is used under various environments. Particularly when it is used under high-humidity environment, the structures described in PTL 1 and PTL 2 suffer deterioration in reliability since the inorganic insulating sheet and the ceramic substrate used as the insulating layer absorb moisture and thus the insulation performance is significantly reduced to shorten the insulation life.

To avoid this, the organic insulating sheet and the ceramic substrate used as the insulating layer are thickened to satisfy the requirement about high moisture resistance. The thickened insulating layer, however, involves the problem of increasing heat resistance to result in poor heat radiation and the problem of cost increase.

Another example includes improving the moisture resistance by coating a printed substrate with a silicon-based material to form an insulating layer (JP-A-2001-168501). The silicon-based coating material, however, may absorb moisture due to high molecular weight and such absorption of moisture may peel the coating material from the printed substrate to deteriorate the reliability as described above.

Thus, it is difficult for the conventional configuration of the insulating layer to achieve both the increase in heat radiation and the high reliability in insulation performance.

The present invention has been made in view of the above problems, and it is an object thereof to provide a semiconductor device which includes an insulating layer having thermal conductivity and realizing high insulation performance.

Solution to Problem

A semiconductor device according to the present invention includes a semiconductor element, a lead frame bonded on one surface to the semiconductor element, a first insulating layer disposed on the other surface of the lead frame, and a metal base plate connected to the lead frame with the first insulating layer interposed between them, wherein an outer peripheral portion of the first insulating layer is inside an outer peripheral portion of the metal base plate, and the outer peripheral portion of the first insulating layer is covered with a second insulating layer having higher moisture resistance and higher insulation performance than the first insulating layer, the outer peripheral portion including an electric field concentrated point in an outer peripheral portion of the lead frame.

Advantageous Effects of Invention

According to the present invention, since the outer peripheral portion of the first insulating layer including the electric field concentrated point in the outer peripheral portion of the lead frame is covered with the second insulating layer having higher moisture resistance and higher insulation performance than the first insulating layer, the semiconductor device which ensures the insulation performance with high reliability even under high-humidity environment can be provided with excellent heat radiation and insulation performance.

Other objects, characteristics, aspects, and effects of the present invention will be more apparent from the following detailed description of the present invention with reference to the accompanying drawings.

DESCRIPTION OF EMBODIMENTS

The present invention will hereinafter be described with reference to the accompanying drawings.

In each figure, the same reference numerals represent the same or corresponding components.

Embodiment 1

Figure 1:
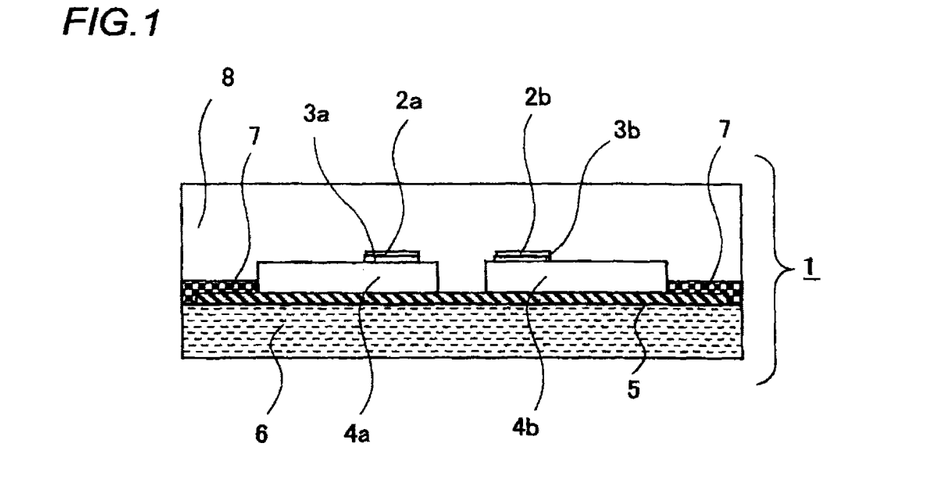
FIG. 1 is a section view showing a semiconductor device according to Embodiment 1 of the present invention

FIG. 1 is a section view showing a semiconductor device according to Embodiment 1 of the present invention and shows an example in which two semiconductor elements 2a and 2b are mounted.

In FIG. 1, a semiconductor device 1 includes the semiconductor elements 2a and 2b, lead frames (conductive members) 4a and 4b for mounting the semiconductor elements 2a and 2b, respectively, and a metal base plate 6 connected to a cooler (not shown) for radiating heat produced in the semiconductor elements 2a and 2b.

The semiconductor element 2a includes a back electrode bonded to the lead frame 4a with solder 3a, and the semiconductor element 2b includes a back electrode bonded to the lead frame 4b with solder 3b, so that the semiconductor elements 2a and 2b are electrically connected to the lead frames 4a and 4b, respectively.

Each of the semiconductor elements 2a and 2b has a front electrode electrically connected with a wire (not shown) and electrically connected to an external connection terminal (not shown) with another wire (not shown).

A first insulating layer 5 with high thermal conductivity such as an insulating sheet and a ceramic substrate is disposed between the lead frames 4a and 4b and the metal base plate 6 connected to the cooler (not shown) for radiating the heat produced in the semiconductor elements 2a and 2b, and a second insulating layer 7 is disposed at an end portion of the first insulating layer 5. The outer peripheral portion of the first insulating layer 5 is inside the outer peripheral portion of the metal base plate 6. In other words, the first insulating layer 5 is formed to have an area smaller than the area of the upper face of the metal base plate 6. Thus, the second insulating layer 7 covers the outer peripheral portion of the first insulating layer 5 including its side face. The second insulating layer 7 has higher moisture resistance and higher insulation performance than those of the first insulating layer 5.

In the semiconductor device 1 thus configured, the semiconductor elements 2a and 2b, and the lead frames 4a and 4b are sealed in by a sealing material 8 such as epoxy resin, silicone gel, and elastomer.

FIG. 1 shows a case in which the semiconductor device 1 includes the two semiconductor elements. In the present embodiment, the semiconductor elements 2a and 2b may be collectively referred to as a semiconductor element 2, the solders 3a and 3b may be collectively referred to as a solder 3, and the lead frames 4a and 4b may be collectively referred to as a lead frame 4.

In general, the insulating layer of the semiconductor device requires two functions, that is, insulation and heat conduction.

The semiconductor device is used under various environments. In the structures described in PTL 1 and PTL 2, especially when the organic insulating sheet and the ceramic substrate used as the insulating layer absorb moisture under high-humidity environment, the insulation performance is significantly reduced to make it difficult to achieve both the insulation and the heat conduction.

External moisture may diffuse into the bulk (the material not in contact with an interface) of the sealing resin or of the high radiation insulating sheet used as the insulating layer or may penetrate through the interface between the sealing resin and the high radiation insulating sheet. As a result, the insulation performance at the end of the lead frame with a high electric field may be reduced to cause a breakdown.

The moisture resistance can be increased by delaying the diffusion of moisture in the high radiation insulating sheet or by blocking the path on which moisture is infused.

A high radiation organic insulating sheet generally used as the insulating layer contains thermosetting resin such as epoxy resin filled with inorganic particles of aluminum nitride (AlN), aluminum oxide (alumina: $Al_2O_3$), boron nitride (BN), silicon carbide (SiC) or the like.

The water diffusion can be restrained by reducing the amount of the filling particles to eliminate the wall faces of the particles serving as the water path. The reduced amount of the filling particles, however, is not possible since it reduces the heat radiation.

The blocking of the water infusion path requires an increase in strength of adhesion between the sealing resin and the insulating layer. Modification of surfaces of the sealing resin and the insulating layer for improving the adhesion is less advantageous since it increases the cost.

When a silicon-based material is used for coating, it may absorb moisture due to high molecular weight and such absorption of moisture may peel the coating material from the printed substrate to deteriorate the reliability.

In addition, as shown in an analysis diagram (FIG. 2) for the electric field at the end portion of the lead frame, an electric field concentrated point 9a occurs near the first insulating layer 5 sandwiched between the lead frame 4 and the metal base plate 6, and an electric field concentrated point 9b also occurs near the sealing material 8 sandwiched between the lead frame 4 and the first insulating layer 5.

Figure 2:
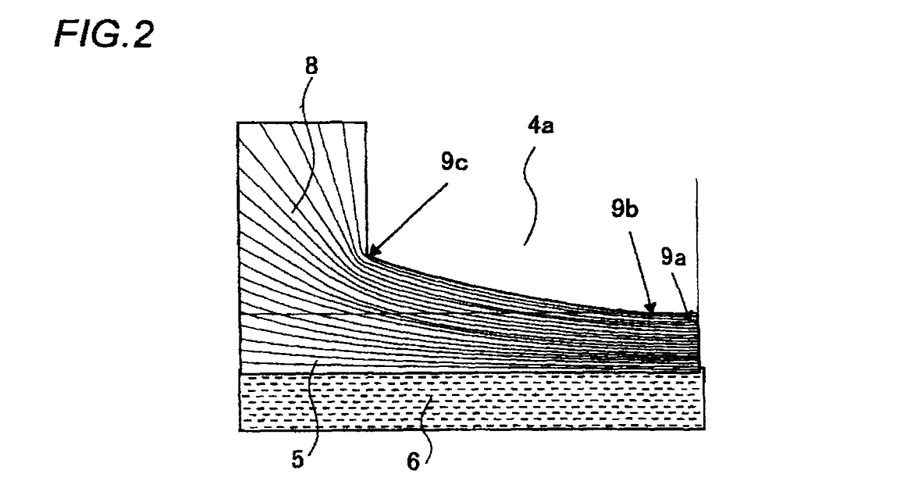
FIG. 2 shows an electric field analysis showing electric field concentrated points in an end portion of a lead frame.

Since the lead frame is typically fabricated by stamping, its corners are often not completely arc-shaped. In this case, an electric field concentrated point 9c also occurs near the point of the sealing material 8 where the arc shape interrupts. Thus, when the sealing material 8 at that point absorbs moisture, the insulation performance is reduced.

In the present invention, the second insulating layer 7 based on epoxy resin (phenol-based) with high moisture resistance is disposed on the outer periphery of the first insulating layer 5 at the position as shown in FIG. 1. In other words, the second insulating layer 7 is formed to cover the outer peripheral portion of the first insulating layer 5 including its side face.

Specifically, the second insulating layer 7 can be provided by filling phenol-based epoxy resin with molten silica at 50 to 90 vol %, for example.

Desirably, the second insulating layer 7 covers the lead frame up to a level higher than the position where the arc shape interrupts, thereby providing the semiconductor device 1 having higher voltage resistance, increased moisture resistance, and excellent insulation performance.

In terms of blocking the water infusion path, it goes without saying that the second insulating layer 7 can be disposed to cover not only the electric field concentrated points 9a, 9b, and 9c, but also the entire interface between the sealing material 8 and the first insulating layer 5 as shown in FIG. 1 to further improve the reliability in insulation performance.

In semiconductor modules, the index of moisture resistance varies among types for electric railroad (HV), industry (IPM), vehicle (T-PM), and discrete component (DIP, SIP), and more particularly, depending on the required levels of moisture resistance and voltage resistance.

By way of example, for a test of moisture resistance, a reference in HV type for electric railroad (ICBT) is a test for voltage resistance for 1000 hr under an environment with a temperature of 60° C. and a humidity of 90% (related standard IEC68-2-3). In general, the performance needs to be maintained for 1000 hr upon application of a voltage at a predetermined ratio to a chip rating voltage under an environment with a humidity of 85%. The second insulating layer 7 with high moisture resistance and high voltage resistance according to the present embodiment can be used to realize the product performance required of the semiconductor module. Particularly, the effect is significantly provided in a semiconductor module with a high rating voltage, for example 6.5 KV.

As described above, the semiconductor device according to the present embodiment is the semiconductor device including the lead frame (referring to the frame 4a and the frame 4b) bonded on one surface to the semiconductor element 2 (referring to the semiconductor element 2a and the semiconductor element 2b), the first insulating layer 5 disposed on the other surface of the lead frame 4, and the metal base plate 6 connected to the lead frame 4 with the first insulating layer 5 interposed between them, wherein the outer peripheral portion of the first insulating layer 5 is covered with the second insulating layer 7 having higher moisture resistance and higher insulation performance than the first insulating layer 5, the outer peripheral portion including the electric field concentrated point in the outer peripheral portion of the lead frame 4.

Thus, the second insulating layer 7 providing high reliability even under high-humidity environment can be used to ensure high moisture resistance and high insulation performance, so that the semiconductor device can be provided with excellent heat radiation and insulation performance.

Specifically, the second insulating layer based on epoxy resin (phenol-based) with high moisture resistance can be disposed on the outer periphery of the first insulating layer to improve the insulation performance while the high moisture resistance is provided.

In the semiconductor device according to the present embodiment, since the outer peripheral portion of the first insulating layer 5 is covered with the second insulating layer 7 up to the level higher than the position of the lead frame 4 (referring to the frames 4a and 4b) where the arc shape at the corner interrupts, the semiconductor device can be provided with the excellent insulation performance while the high moisture resistance is provided.

Embodiment 2

Figure 3A:
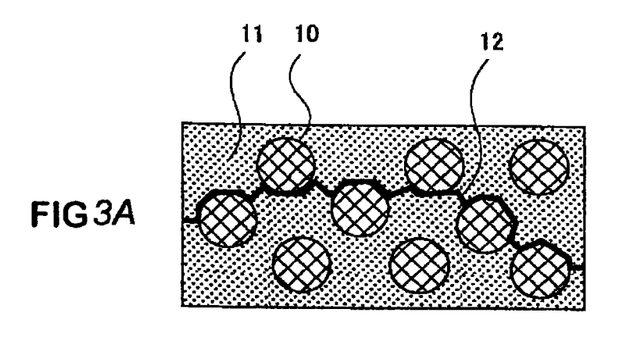
FIG. 3A and FIG. 3B show schematic section views of the internal structure of a second insulating layer forming part of a semiconductor device according to Embodiment 2 of the present invention and the configuration during its manufacture process.
Figure 3B:
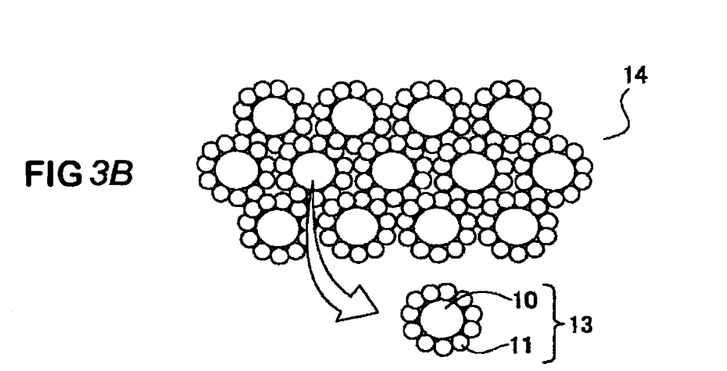

FIG. 3A and FIG. 3B are schematic section views for describing the configuration of a second insulating layer 7 in Embodiment 2. FIG. 3A is a schematic view showing part of the second insulating layer 7 in cross section, and FIG. 3B is a section view of the second insulating layer 7 during a step of manufacturing the same.

To prevent the peel of the second insulating layer 7 from a first insulating layer 5 or a lead frame 4 due to expansion and contraction of the first insulating layer 5 or the lead frame 4 resulting from heating or the like in a heat cycle or a module manufacture process, the second insulating layer 7 necessarily includes silica particles 10 mixed therein for adjusting α.

In this case, α represents the linear expansion coefficient and is approximately 12 to 14 for a sheet or an insulating substrate used in the module. To provide the linear expansion coefficient α approximately equal to those values in the second insulating layer as in the present invention, the filling amount of the silica filler needs to be increased than that in conventional cases.

As shown in FIG. 3A, the second insulating layer 7 is configured such that the silica particles 10 are dispersed at intervals between them in resin particles 11 which are phenol-based epoxy resin. A specific method of forming the second insulating layer 7 of such a configuration is described with reference to FIG. 3B.

As shown in FIG. 3B, the resin particle 11 is provided, for example by a nanometer-scale resin particle 11 smaller than the silica particle 10 in diameter. The surface of the silica particle 10 is covered with the resin particles 11 to form a resin covered particle 13. A paste 14 provided by dispersing the formed resin covered particles 13 is applied to a metal base plate 6. After drying, heating is performed to melt and cure the resin constituting the resin particles 11.

This ensures that the resin material constituting the resin particles 11 is interposed between the adjacent silica particles 10. In other words, the realized structure can include the resin 11 present between the silica particles 10 without fail. This eliminates a creepage surface breakdown path 12 along a creepage surface direction of the first insulating layer 5 resulting from overlapping interfaces of the silica particles 10, thereby achieving high voltage resistance.

Figure 4:
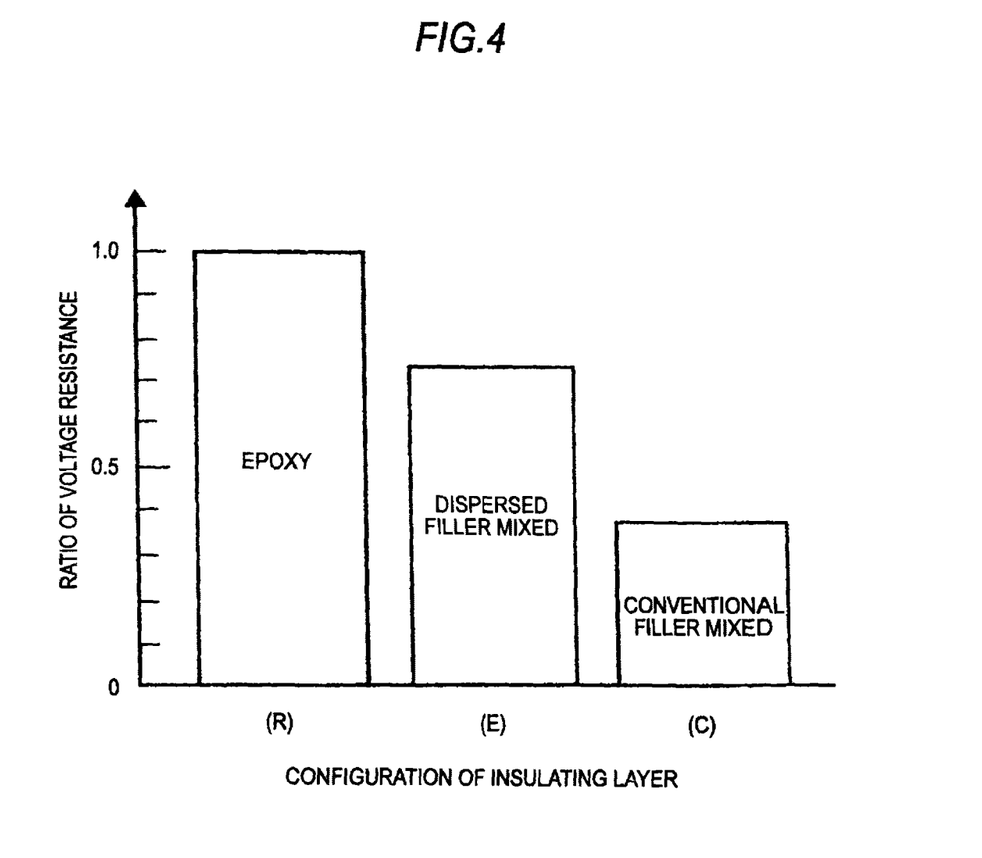
FIG. 4 is a diagram showing the results of a test for voltage resistance in a dry condition of the second insulating layer according to Embodiment 2 and a conventional insulating layer.

FIG. 4 shows the results of a test for voltage resistance in a dry condition.

As compared with a conventional case in which an insulating layer is formed simply by mixing silica particles with a resin material (C in FIG. 4), the second insulating layer 7 of the present embodiment (E in FIG. 4) formed such that the silica particles 10 are dispersed at intervals between them in the resin 11 exhibits more favorable breakdown resistance voltage. The breakdown resistance voltage is lower than but closer to the highest breakdown resistance voltage of an insulating layer formed only of epoxy resin (R in FIG. 4).

Figure 5:
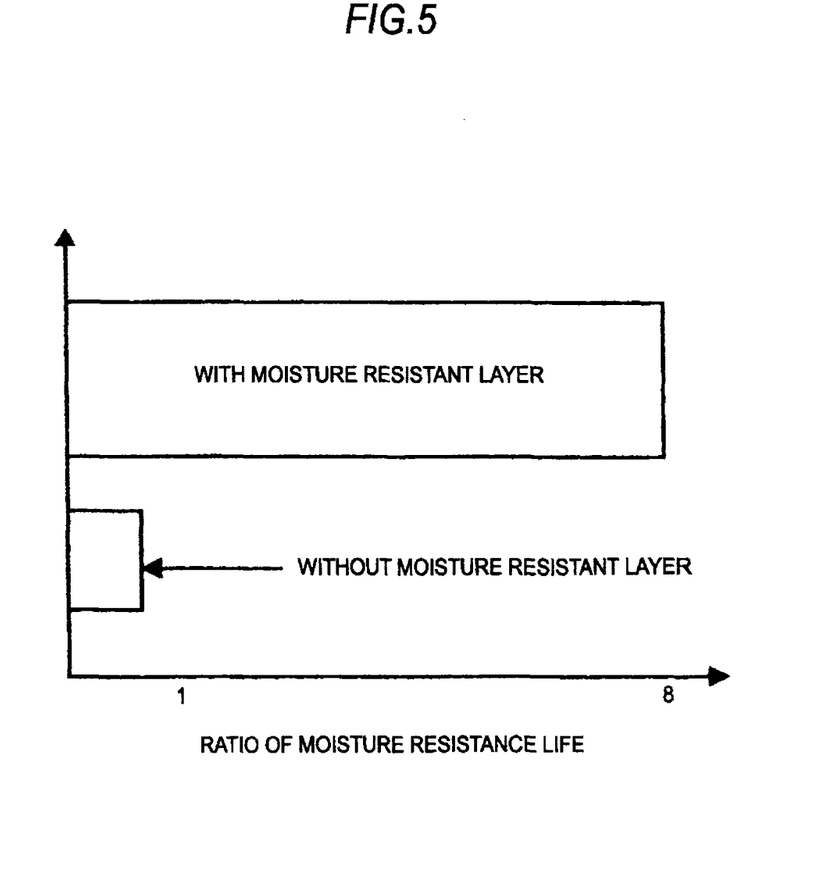
FIG. 5 is a diagram showing a ratio of moisture resistance life between the second insulating layer in Embodiment 2 and a conventional insulating layer.

FIG. 5 shows a comparison of time until breakdown when a constant voltage is applied in a moisture-absorbing condition (a temperature of 85° C. and a humidity of 85%).

When the structure of the present invention is not used, moisture is absorbed to saturation in a short time. When the structure is used, the moisture absorption is delayed to extend the time until saturation.

As apparent from FIG. 5, when the configuration is used, the life becomes approximately 8 times longer than the conventional one.

As described above, the second insulating layer of the present embodiment can be used to manufacture the semiconductor device having both the high moisture resistance and the high insulation performance.

Figure 6:
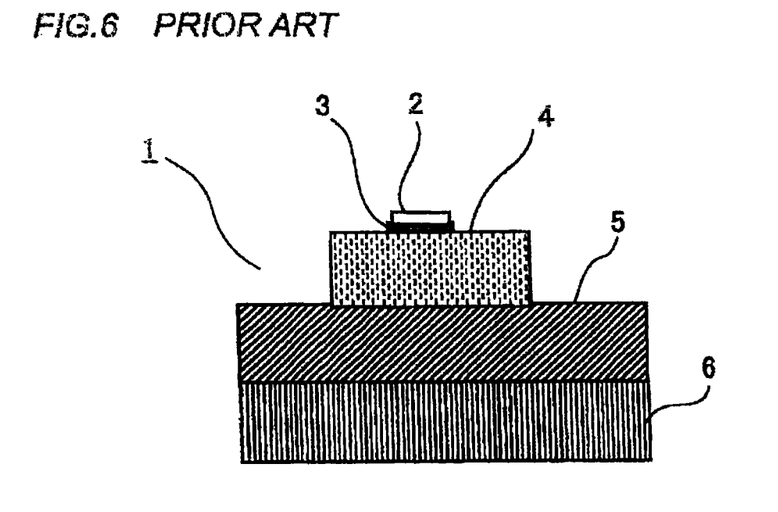
FIG. 6 is a section view showing the configuration of a semiconductor device in a comparative example.

FIG. 6 is a section view showing the configuration of a conventional semiconductor device as a comparative example.

More specifically, the dispersion of the silica particles can increase the filling amount to reduce a difference in thermal expansion coefficient between the first insulating layer (insulating sheet, insulating substrate) and another structure material to prevent peel serving as a moisture penetrating path and any crack due to concentrated stress, thereby achieving the high moisture resistance which the resin essentially has when no defects are present.

Particularly, in the present embodiment, the phenol-based epoxy resin which itself has high moisture resistance (low moisture absorption) is used, the effect of dispersing the silica particles can be more obvious to provide the second insulating layer 7 with high moisture resistance.

It goes without saying that, for the shape of the silica particles, spherical molten silica can be used instead of pointed crushed silica to reduce the concentration of an electric field to attain higher voltage resistance.

It goes without saying that electrostatic absorption can be used for the placement of the nanometer-scale resin particles on the surfaces of the silica particles in the second insulating layer to realize higher heat electric conduction and higher voltage resistance.

As described above, in the semiconductor device according to the present embodiment, the second insulating layer 7 contains the aggregate of the epoxy resin collected in shell form around the silica particles, and the plurality of aggregates are filled in contact with each other.

To prevent the peel of the second insulating layer 7 from the first insulating layer 5 or the lead frame 4 due to expansion and contraction of the first insulating layer 5 or the lead frame 4 resulting from heating or the like in a heat cycle or a module manufacture process, the second insulating layer 7 necessarily includes silica particles 10 mixed therein for adjusting α.

Since the aggregate is formed such that the epoxy resin serving as the insulator is collected in shell form around the silica particles, and the plurality of aggregates are filled in contact with each other, the silica particles 10 are uniformly dispersed to eliminate the breakdown path in a bulk direction caused by overlapping silica particles 10, resulting in higher voltage resistance.

The fillers of the second insulating layer 7 are disposed at intervals between them in the resin. Even when the creepage surface breakdown path 12 is produced, the produced creepage surface breakdown path 12 is discontinued.

The creepage surface breakdown path 12 proceeds along the filler interface. However, the creepage surface breakdown path 12 is discontinued by the fillers dispersed at intervals in the resin, so that the insulation life is extended, and the higher voltage resistance can be achieved while stress adjustment can be performed similarly to the above.

In the present embodiment, the semiconductor element 2 (semiconductor element 2a and semiconductor element 2b) is formed of a wide bandgap semiconductor material.

The insulation structure provided with the high moisture resistance and high insulation performance allows semiconductor system design exploiting high driving voltage which is an advantage of the wide bandgap semiconductor.

The wide bandgap semiconductor material is one of silicon carbide, gallium nitride material, and diamond.

The insulation structure provided with the high voltage resistance allows semiconductor system design exploiting high driving voltage which is an advantage of the semiconductors made of silicon carbide and gallium nitride.

Although the above description has been made assuming that the semiconductor device has the configuration as shown in Embodiment 1, the number of the semiconductor elements is not limited to two, but the number may be set suitably for applications (for example, one, or three or more). The means for electrical connection is not limited to the wire, but a spherical electrode, an interposer, a printed circuit board, or a direct lead scheme can be used to achieve the same effects.

Although the above description has been made of the exemplary semiconductor device of a transfer mold type, the present invention is applicable to a semiconductor device manufactured with a different method, such as a semiconductor device of a case type attached to a case similar to the semiconductor device described in PTL 1. It goes without saying that such a semiconductor device can achieve the same effects.

A semiconductor device of an integrated or separated heatsink type can be configured as in Embodiment 1 and can achieve the same effects as those in Embodiment 1. The semiconductor element is not limited to a silicon (Si) element, but the same effects can be provided by any semiconductor element including a compound semiconductor such as a silicon carbide (SIC) semiconductor and a gallium nitride semiconductor. The same effects can also be achieved from a transistor and an integrated circuit (IC) other than the diode (Di) and the IGBT.

Particularly, the semiconductor element capable of high-temperature operation can be provided by using a gallium nitride-based material or a diamond, in addition to silicon carbide. For example, when the silicon carbide, gallium nitride-based material, or diamond is used for a semiconductor element serving as a switching element or a rectifying element, the resulting element has power loss lower than a conventionally used element made of silicon (Si) to increase the efficiency in the semiconductor device capable of high-temperature operation such as a power semiconductor device. Since voltage resistance is high and allowable current density is high, the semiconductor device can be reduced in size.

In addition, since the wide bandgap semiconductor element has high heat resistance, high-temperature operation can be performed. This can reduce the size of a heat radiating fin of a heatsink and replace a water-cooler with an air-cooler, so that the semiconductor device can be further reduced in size.

Different semiconductor devices can be configured similarly to Embodiment 1 such as a bond type in which an electrode, a semiconductor chip, an insulating substrate and the like are electrically connected through solder, a pressure-bonding type in which an electrode, a semiconductor chip, an insulating substrate and the like are electrically connected by pressing with an elastic body or bolting from the outer direction to the inner direction of the electrode, and a composite type thereof. These types can provide the same effects as those in Embodiment 1.

INDUSTRIAL APPLICABILITY

The present invention is useful in realizing the semiconductor device which ensures the insulation performance with high reliability even under high-humidity environment and provides the excellent heat radiation and insulation performance.

It should be noted that the embodiments of the present invention may be freely combined and that each of the embodiment may be modified or omitted as appropriate without departing from the scope of the present invention.

REFERENCE SIGNS LIST

1: Semiconductor device
2, 2a, 2b: Semiconductor element
3, 3a, 3b: Solder
4, 4a, 4b: Lead frame
5: First insulating layer
6: Metal base plate
7: Second insulating layer
8: Sealing material
9a, 9b, 9c: Electric field concentrated point
10: Silica particle
11: Resin particle 12: Creepage surface breakdown path
13: Resin covered particle
14: Paste

The invention claimed is:

1. A semiconductor device comprising:
a semiconductor element;
a lead frame bonded on one surface to the semiconductor element;
a first insulating layer disposed on the other surface of the lead frame; and
a metal base plate connected to the lead frame with the first insulating layer interposed between the base plate and the lead frame, wherein
an outer peripheral portion of the first insulating layer is outside an outer portion of the lead frame and is inside an outer portion of the metal base plate;
the outer peripheral portion of the first insulating layer and a side surface of the first insulating layer are covered with the second insulating layer, said second insulating layer having higher moisture resistance and higher insulation performance than the first insulating layer, the outer peripheral portion of the first insulating layer including an electric field concentrated point in the outer portion of the lead frame; and
the second insulating layer includes epoxy resin filled around silica particles.

2. The semiconductor device according to claim 1, wherein the outer portion of the lead frame is covered with the second insulating layer up to a level higher than a position where an arc shape of the lead frame at a corner interrupts.

3. The semiconductor device according to claim 1, wherein the silica particles in the second insulating layer are dispersed at intervals between the particles in the resin.

4. The semiconductor device according to claim 1, wherein the semiconductor element is formed of a wide bandgap semiconductor material.

5. The semiconductor device according to claim 4, wherein the wide bandgap semiconductor material is one of silicon carbide, a gallium nitride-based material, and diamond.

* * * * *